United States Patent
Yoon

(10) Patent No.: US 6,847,663 B2
(45) Date of Patent: Jan. 25, 2005

(54) WAVELENGTH LOCKER AND METHOD FOR LOCKING WAVELENGTHS FOR OPTICAL TRANSMITTERS

(75) Inventor: Young-Kwon Yoon, Anyang-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/382,951

(22) Filed: Mar. 6, 2003

(65) Prior Publication Data

US 2003/0169789 A1 Sep. 11, 2003

(30) Foreign Application Priority Data

Mar. 11, 2002 (KR) .................................. 10-2002-0012836

(51) Int. Cl.$^7$ ................................................. H01S 3/00

(52) U.S. Cl. ......................................................... 372/32

(58) Field of Search ............................. 372/38.1–38.09, 372/32, 20–23, 34

(56) References Cited

U.S. PATENT DOCUMENTS 4,508,964 A * 4/1985 Gunning et al. .......... 250/201.1

* cited by examiner

*Primary Examiner*—Quyen Leung
(74) *Attorney, Agent, or Firm*—Cha & Reiter, LLC

(57) ABSTRACT

Disclosed is a wavelength locker and a method for locking wavelengths for an optical transmitter which includes a semiconductor light source for projecting light for optical communication from the front face thereof, the oscillating wavelength of the optical transmitter changing according to the working temperature, and a heater for maintaining the working temperature of the semiconductor light source at a predetermined value. The wavelength locker includes: a detector for detecting the light projected from the rear face of the semiconductor light source; a Fabry-Perot filter which is interposed between the semiconductor light source and the detector and comprises a spacer formed from a non-linear optical material, the transmittance of the Fabry-Perot filter shifting with respect to the wavelength depending on the change of the transmittance of the spacer; and, a control circuit for changing the refractive index of the Fabry-Perot filter so that the Fabry-Perot filter exhibits a predetermined transmittance in relation to the oscillating wavelength of the semiconductor light source.

7 Claims, 10 Drawing Sheets

WAVELENGTH LOCKER AND METHOD FOR LOCKING WAVELENGTHS FOR OPTICAL TRANSMITTERS

CLAIM OF PRIORITY

This application claims priority to an application entitled "WAVELENGTH LOCKER FOR OPTICAL TRANSMITTER," filed in the Korean Industrial Property Office on Mar. 11, 2002 and assigned Serial No. 2002-12836, the contents of which are hereby incorporated by reference.

BACKGROUND OF THE INVENTION

1. Field of the Invention

The present invention generally relates to an optical transmitter. In particular, the present invention relates to a wavelength locker is provided in the optical transmitter for locking the wavelength of an optical signal.

2. Description of the Related Art

The wavelength-division-multiplexing (WDM) technology has been a great area of research as it can allow for the transmission of increasing information without largely changing the backbone network of an optical communication system. Consequently, the possible employment of both the 100-GHz spacing wavelength-division-multiplexing technology which is currently used in the existing system, as well as the 50-GHz dense wavelength-division-multiplexing (DWDM) technology has been of great interest. In order to implement such a dense wavelength-division-multiplexing technology, it is necessary for an oscillating wavelength to be maintained within an error range not to exceed 20 pm. Because it is difficult to implement the dense wavelength-division-multiplexing technology merely by securing the stability of an oscillator itself, optical transmitters are widely used and are individually provided with a wavelength locker disposed outside the oscillator. Such wavelength lockers are classified as either an exterior type which is provided outside of optical transmitters, or an interior type which is integrated inside of optical transmitters. In view of easy system construction, price and other factors, it is expected that the demand for the interior type wavelength lockers will increase.

FIG. 1 schematically illustrates an optical transmitter provided with a wavelength locker of the prior art. The optical transmitter comprises a laser diode (LED) 110, a Fabry-Perot filter 120, a photodiode (PD) 130, an analog/digital converter (ADC) 140, a controller 150, a digital/analog converter 160, a bias circuit 170, and a thermoelectric cooler (TEC) 180.

The laser diode 110 is a semiconductor component, which projects light with a predetermined wavelength through its front and rear faces. The light projected through the rear face is used for monitoring the oscillating wavelength of the laser diode 110. That is, the stabilized optical transmission can be executed by monitoring the oscillating wavelength of the laser diode 110 and correcting a wavelength error when the error occurs. The wavelength of the laser diode 110 changes as the operating temperature of the laser diode 110 changes.

The Fabry-Perot filter 120 may consist of a spacer formed from a linear optical material and two reflecting layers each being formed on one of the front and rear faces of the spacer, wherein the Fabry-Perot filter 120 has a predetermined transmittance spectrum depending on the thickness and refractive index of the spacer. That is, if the light projected through the rear face of the laser diode 110 is incident to the Fabry-Perot filter 120, the power of the transmitted light will vary depending on the wavelength of the light. Therefore, it is possible to find the wavelength of the light by measuring the power of the light projected from the Fabry-Perot filter 120.

The photodiode 130 converts the light that is incident to the Fabry-Perot filter 120 into an electrical signal and outputs the electrical signal.

The analog/digital converter 140 converts the electrical signal into a digital signal and outputs the digital signal to the controller 150.

The controller 150 perceives the power of the light from the electrical signal and finds the wavelength of the light based upon the power of the light. If the wavelength determined from this operation does not match a predetermined wavelength value, then the controller 150 outputs a control signal for correcting the wavelength error.

The digital/analog converter 160 converts the control signal into an analog signal and outputs the analog signal to the bias circuit 170.

The bias circuit 170 applies electric current to the thermoelectric cooler 180 in response to the control signal output by the controller 150. That is, the level of the applied electric current is determined by the control signal.

The thermoelectric cooler 180 is operated by the electric current applied by the bias circuit 170 and functions to maintain the temperature of the laser diode 110 to be constant at a predetermined temperature.

FIG. 2 is a flowchart showing the setting procedure of the optical transmitter shown in FIG 1. FIG. 3 is a drawing illustrating the setting procedure shown in FIG 2. The setting procedure consists of a channel-setting step 210, a working temperature-setting step 220, and a Fabry-Perot filter-aligning step 230.

The channel-setting step 210 is a step for setting a specific channel from a group of usable International Telecommunication Union (ITU) channels. Referring to FIGS. 3a and 3b, one channel 310 is selected from a series of ITU channels and the oscillating wavelength of the laser diode 110 is biased to an edge of the set channel 310 prior to the working temperature-setting step 220.

The working temperature-setting step 220 adjusts the working temperature of the laser diode 110 in order to match the oscillating wavelength to the center of the selected channel 310. According to this step, it can be seen that the oscillating wavelength moves from the edge to the center of the set channel 310 (320→350).

The Fabry-Perot filter-aligning step 230 is a step for aligning the oscillating wavelength of the laser diode 110 and the transmittance of the Fabry-Perot filter 120. Referring to FIG. 3c, the oscillating wavelength of the laser diode 110 is laid in the flat region of the transmittance spectrum prior to the Fabry-Perot filter-aligning step 230. For this reason, a problem arises because it is impossible to find such a wavelength change, and because the power of the light projected from the Fabry-Perot filter 120 changes slightly even if the oscillating wavelength of the laser diode 110 fluctuates within the flat region. Therefore, the Fabry-Perot filter 120 is aligned (340→350) in such a manner that the oscillating wavelength can be fixed in a wavelength region where the change of the transmittance of the Fabry-Perot filter 120 is large—i.e. close to a wavelength that exhibits a mean transmittance of the maximum and minimum transmittances. At this time, the aligning step 230 is conducted by aligning the incident angle θ of the light that is incident in the Fabry-Perot filter 120 and the optical axis of the Fabry-Perot filter 120. That is, the aligning step 230 is conducted by aligning the optical axis of the laser diode 110 and the optical axis of the Fabry-Perot filter 120. It can be seen that the oscillating wavelength of the laser diode 110 is fixed close to the wavelength which exhibits the mean transmittance of the maximum and minimum transmittances of the Fabry-Perot filter 120 while passing through the aligning step 230.

FIG. 4 shows a transmittance spectrum for the Fabry-Perot filter 120 shown in FIG. 1 in relation to the incident angle θ. The transmittance spectrum is obtained when the thickness of the spacer is 20 μm and the coefficient of finess is 10. From the drawing, it can be seen that the transmittance spectrum rapidly moves to the shorter wavelength side (410→420→430) as the incident angle θ increases by increments of 1° from 0°. That is, it can be seen that the wavelength moves 0.3 nm every time the incident angle θ changes 1°, and thus the aligning error of the Fabry-Perot filter 120 should be limited to approximately 0.1° considering that a 50-GHz ITU channel grid is 0.4 nm. However, there are problems in that it is extremely difficult to conduct such an alignment manually, and the separate use of an expensive active alignment installation will excessively increase production costs.

As described above, wavelength lockers for optical transmitters of the prior art experience problems with the alignment of the Fabry-Perot filter. Either manual alignment is required which is an extremely difficult procedure considering the precision required, or an active alignment installation must be used which is a very expensive procedure increasing the production cost of the optical transmitter.

Accordingly, there is a need to provide a wavelength locker for an optical transmitter that does not require the fine geometrical alignment of the Fabry-Perot filter.

SUMMARY OF THE INVENTION

According to one aspect of the invention, there is provided a wavelength locker for an optical transmitter which includes a semiconductor light source for projecting light for optical communication from the front face thereof, an oscillating wavelength of the optical transmitter changing with the working temperature of the semiconductor light source, and a heater for maintaining the working temperature of the semiconductor light source at a predetermined value, wherein the wavelength locker comprises: a detector for detecting the light projected from the rear face of the semiconductor light source; a Fabry-Perot filter which is interposed between the semiconductor light source and the detector including a spacer formed from a non-linear optical material, wherein the transmittance of the Fabry-Perot filter changes in relation to the wavelength depending on the change of the transmittance of the spacer; and, a control circuit for changing the refractive index of the Fabry-Perot filter so that the Fabry-Perot filter exhibits the preset transmittance in relation to the oscillating wavelength of the semiconductor light source.

According to another aspect of the invention, there is also provided a method of locking the wavelength of an optical transmitter, comprising the steps of: detecting a light projected from the rear face of a semiconductor light source; providing a Fabry-Perot filter with means for shifting transmittance of the filter with respect to its wavelength in a predetermined manner; and, providing a control circuit for changing the refractive index of the Fabry-Perot filter to exhibit the predetermined transmittance in relation to the oscillating wavelength of the semiconductor light source.

BRIEF DESCRIPTION OF THE DRAWINGS

The above and other features and advantages of the present invention will be more apparent from the following detailed description taken in conjunction with the accompanying drawings.

DETAILED DESCRIPTION OF THE PREFERRED EMBODIMENTS

Figure 1:
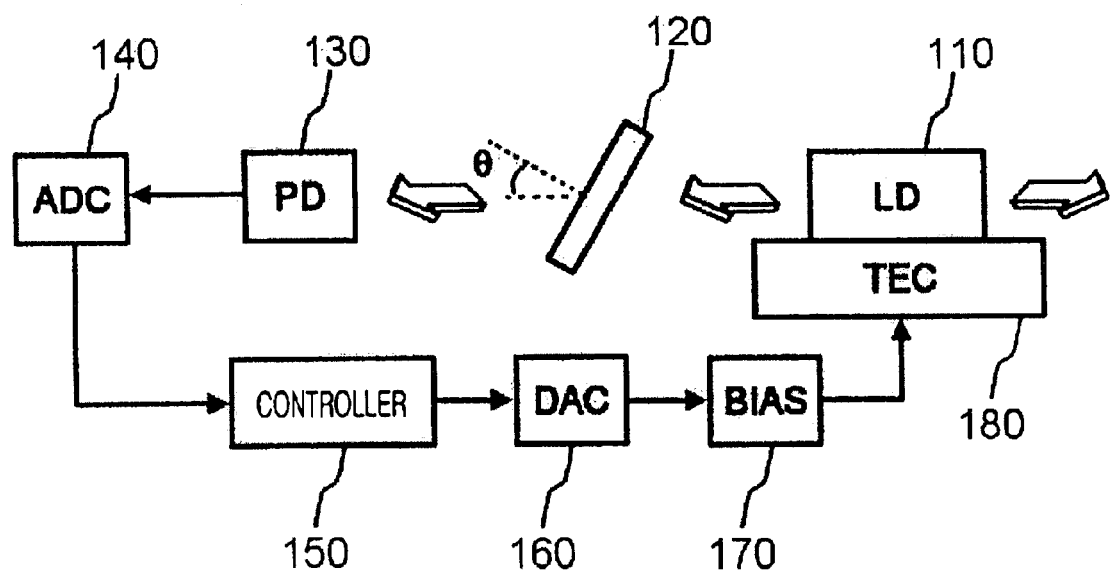
FIG. 1 schematically shows the construction of an optical transmitter provided with a wavelength locker of the prior art.
Figure 2:
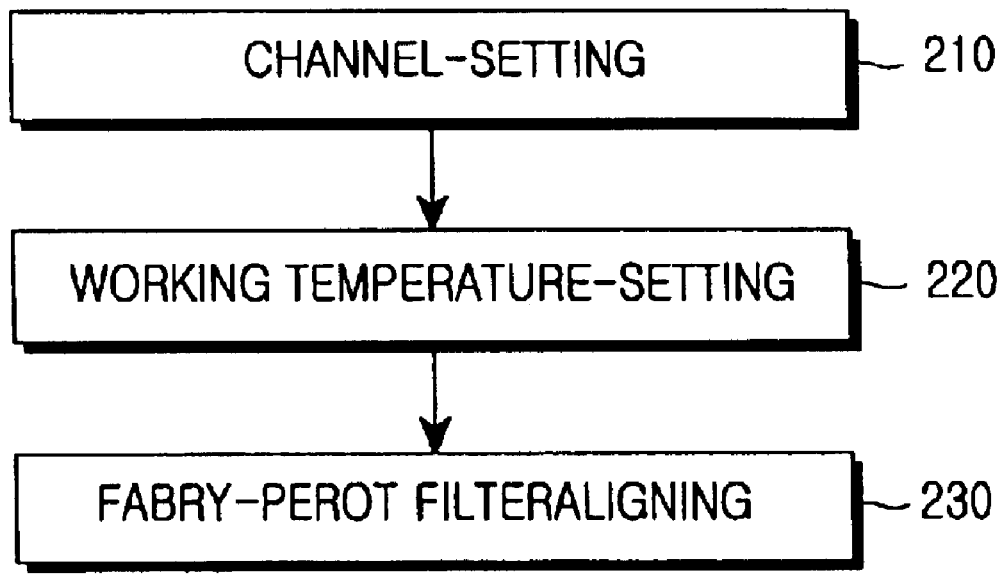
FIG. 2 is a flowchart showing the setting procedure of the optical transmitter shown in FIG. 1.
Figure 3A:
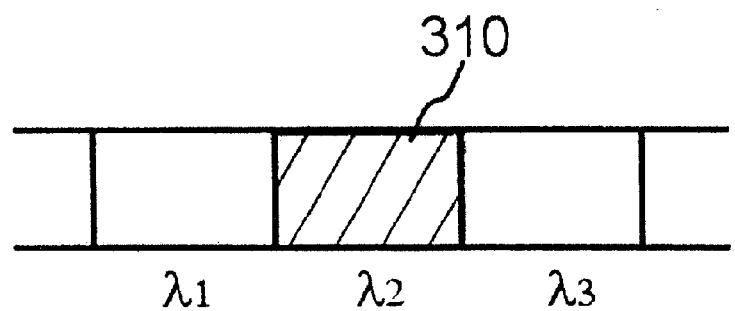
FIG. 3 a drawing for illustrating the setting procedure shown in FIG. 2.
Figure 3B:
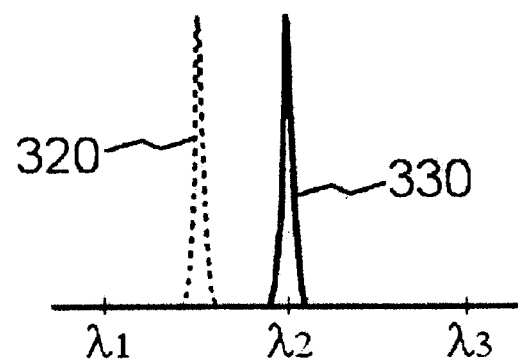
Figure 3C:
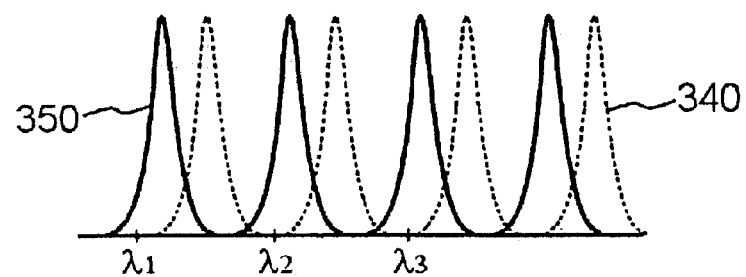
Figure 4:
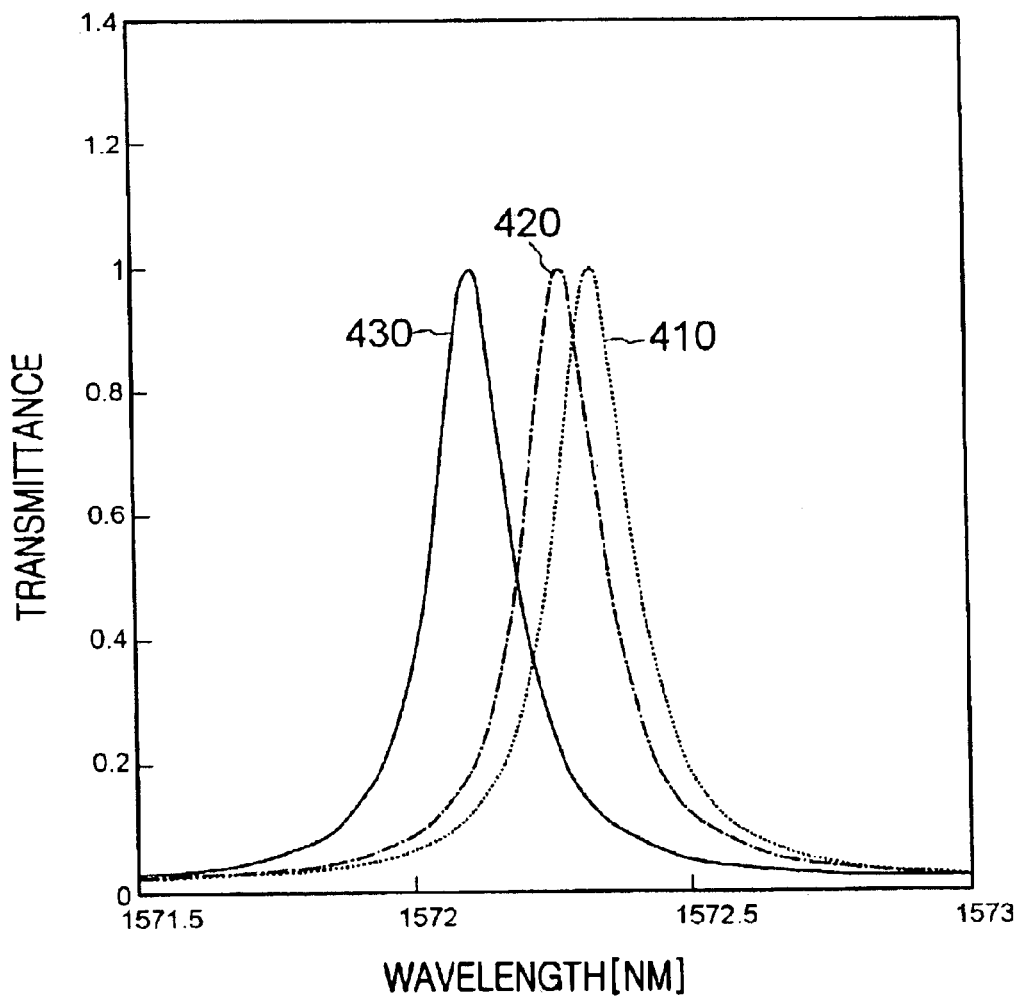
FIG. 4 shows a transmittance spectrum for the Fabry-Perot filter shown in FIG. 1 in relation to the incident angle.

Hereinafter, preferred embodiments of the present invention will be described in detail with reference to the accompanying drawings. It shall be noted that in the drawings, identical components are indicated by identical referential numerals and symbols. For the purposes of clarity and simplicity, a detailed description of known functions and configurations incorporated herein will be omitted as they would obscure the invention in unnecessary detail.

Figure 5:
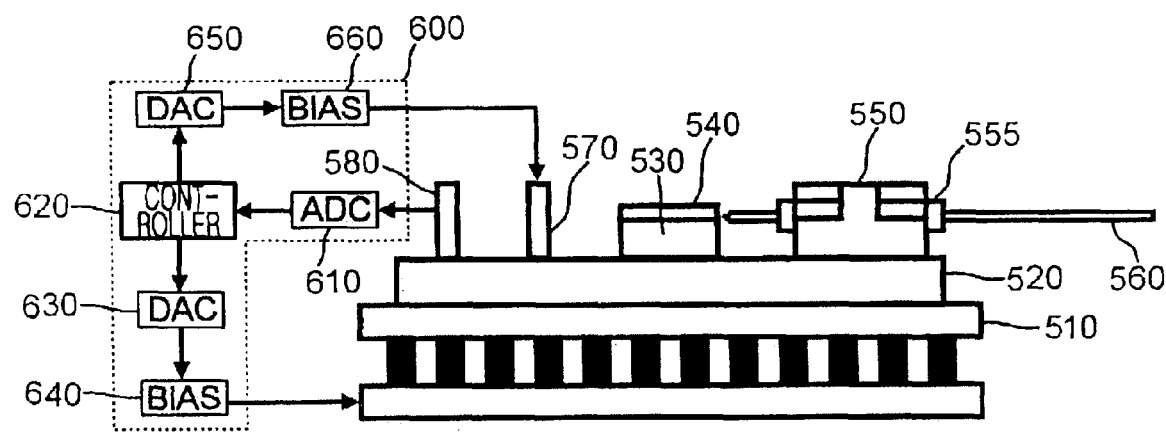
FIG. 5 schematically shows the construction of a wavelength locker for an optical transmitter in accordance with the first embodiment of the present invention.
Figure 6:
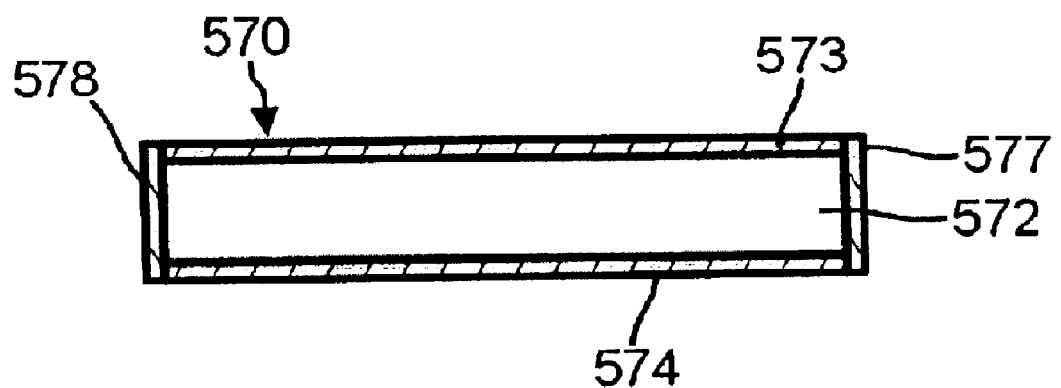
FIG. 6 is a cross-sectional view showing the construction of the Fabry-Perot filter shown in FIG. 5.

FIG. 5 schematically shows the construction of a wavelength locker for an optical transmitter in accordance with the first embodiment of the present invention. FIG. 6 is a cross-sectional view showing the construction of he Fabry-Perot filter shown in FIG. 5. The optical transmitter comprises a heater 510, a substrate 520, a submount 530, a semiconductor light source 540, a support 550, 555, a Fabry-Perot filter 570, a detector 580, and a control circuit 600.

The heater 510 is operated by electric current applied thereto and functions to maintain the temperature of the semiconductor light source 540 to be constant at a predetermined value. A thermoelectric cooler may be used for the heater 510.

The substrate 520 is secured to the top surface of the heater 510 with a bonding material formed from InAg, having a melting point of approximately 130° C. The substrate may be made from Kovar so that laser welding can be easily performed.

The submount 530 is secured to the top surface of the substrate 520 with a bonding material made from AgSn, having a melting point of approximately 210° C.

The semiconductor light source 540 is secured to the top surface of the submount 530 with a bonding material formed from AuSn, having a melting point of approximately 280° C. The semiconductor light source 540 projects light having a predetermined wavelength through the front and rear faces thereof and its oscillating wavelength changes with its working temperature. The light projected through the front face is used for optical communication and the light projected through the rear face is used for monitoring the oscillating wavelength of the semiconductor light source 540. It is possible to use a laser diode, a light emitting diode (LED) or the like for the semiconductor light source 540.

The support comprises a ferrule 555 and a submodule 550 and is secured to the top surface of the substrate 520.

The submodule 550 is formed from the identical material to that of the substrate 520 and aligned facing the front face of the semiconductor light source 540.

The ferrule 555 has a diameter of approximately 2.7 mm and is fixed through the submodule 550 using laser welding. The ferrule 555 is provided with a cylindrical hole (not shown), through which an optical fiber 560 is inserted, wherein the end of the optical fiber 560 faces the front face of the semiconductor light source 540.

The Fairy-Perot filter 570 is interposed between the semiconductor light source 540 and the detector 580 and secured to the top surface of the substrate 520 with the bonding material made of AuSn, having a melting point of 280° C. The Fabry-Perot filter 570 includes a spacer 572 formed from a non-linear optical material, two reflecting layers 573 and 574 each being deposited on one of the front and rear surfaces of the spacer 572, and two electrodes 577 and 578 each being layered on the opposite sides of the spacer 572. Due to the characteristics of the non-linear optical material, the refractive index of the Fabry-Perot filter 570 changes depending on the electric field applied thereto or the change of its internal temperature. Therefore, if an electric field of a predetermined magnitude is applied to the Fabry-Perot filter 570 through the two electrodes 577 and 578, the refractive index of the spacer 572 changes predictably and thus the transmittance spectrum of the Fabry-Perot filter 570 will shift in relation to the wavelength.

Figure 7:
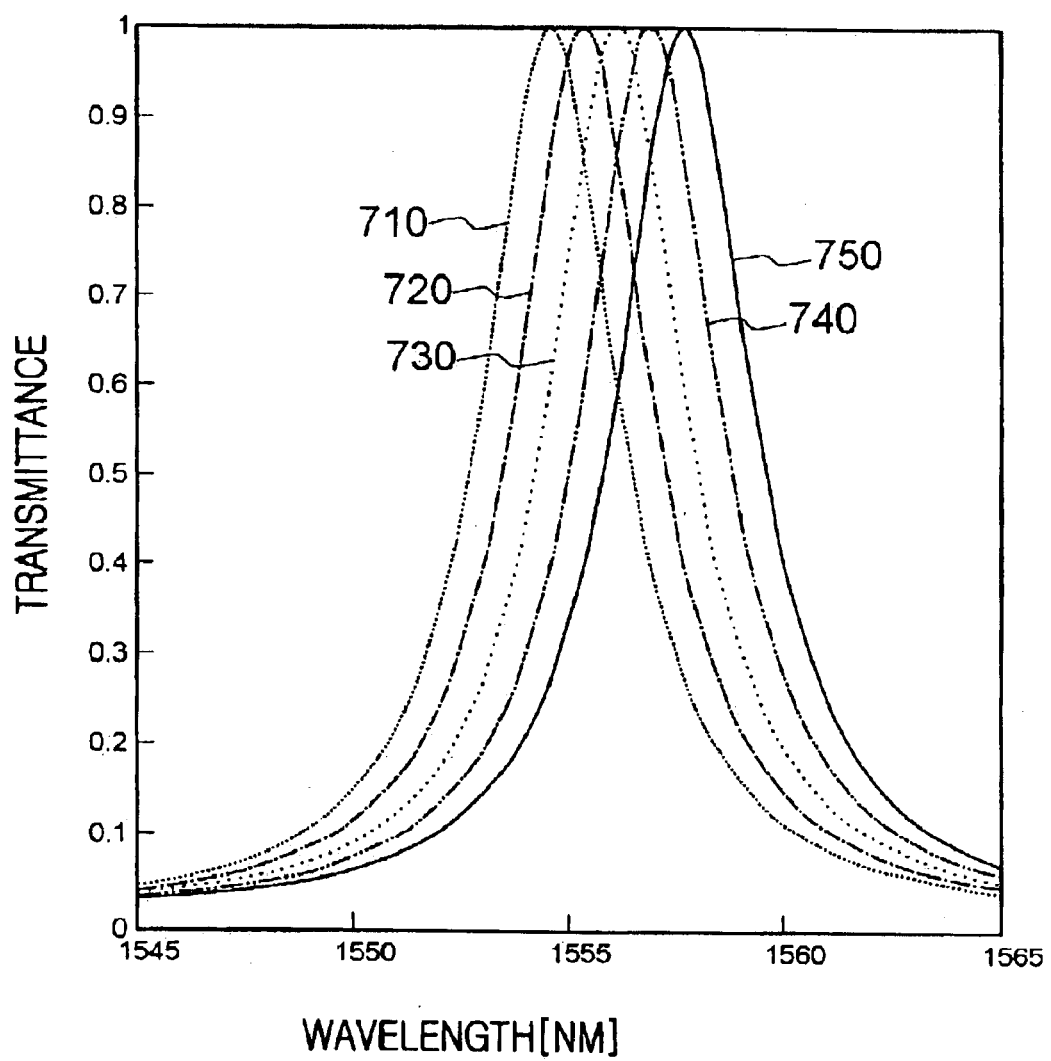
FIG. 7 shows a transmittance spectrum for the Fabry-Perot filter in accordance with the present invention in relation to the incident angle.

FIG. 7 shows a transmittance spectrum for the Fabry-Perot filter 570 in accordance with the present invention with respect to the refractive index of the spacer 572. The spectrum is obtained when the thickness of the spacer 572 is 50 $\mu$m and the coefficient of finess is 20. From the chart, it is apparent that, as the refractive index of the spacer 572 increases by an increment of 0.0007 from 1.4486, the corresponding transmittance spectrum shifts to the longer wavelength side (710→720→730→740→750).

The detector 580 converts the light that is incident through the Fabry-Perot filter 570 into an electrical signal and outputs the electrical signal. For the detector 580, a photodiode chip, a charge coupled device (CCD) or the like may be used. The detector 580 is secured to the front surface of the substrate 520 with the bonding material made of AuSn having a melting point of approximately 280° C.

The control circuit 600 has two control modes. The first control mode is associated with optical communication. The second control mode is associated with setting the working condition of the Fabry-Perot filter 570. At the first control mode, the control circuit 600 corrects the wavelength error when the wavelength does not match with the predetermined wavelength value. At the second control mode, the control circuit 600 changes the refractive index of the Fabry-Perot filter 570, so that a wavelength at which the transmittance of the Fabry-Perot filter 570 has a mean value of the maximum transmittance and the minimum transmittance is close to or preferably conforms to the oscillating wavelength of the semiconductor light source 540. The control circuit 600 comprises an analog/digital converter 610, a controller 620, first and second digital/analog converters 630 and 650, and first and second bias circuit 640 and 660.

The analog/digital converter 610 converts the electrical signal output by the detector 580 into a digital signal and outputs the digital signal to the controller 620.

The first digital/analog converter 630 converts the first control signal output by the controller 620 into an analog signal and outputs the analog signal to the first bias circuit 640.

The first bias circuit 640 applies an electric current to the heater 510 in response to the first control signal. That is, the level of the applied electric current is determined by the first control signal.

The second digital/analog converter 650 converts the second control signal output by the controller 620 into an analog signal and outputs the analog signal to the second bias circuit 660.

The second bias circuit 660 applies an electric voltage of a predetermined magnitude to the two electrodes 577 and 578 of the Fabry-Perot filter 570 in response to the second control signal. That is, the level of the applied electric voltage is determined by the second control signal.

The controller 620 perceives the power of the light from the electric signal when working at the first control mode and then determines the wavelength of the light from the power of the light. The controller 620 outputs the first control signal for correcting the wavelength error when the wavelength of the light does not match the predetermined wavelength value.

Figure 8:
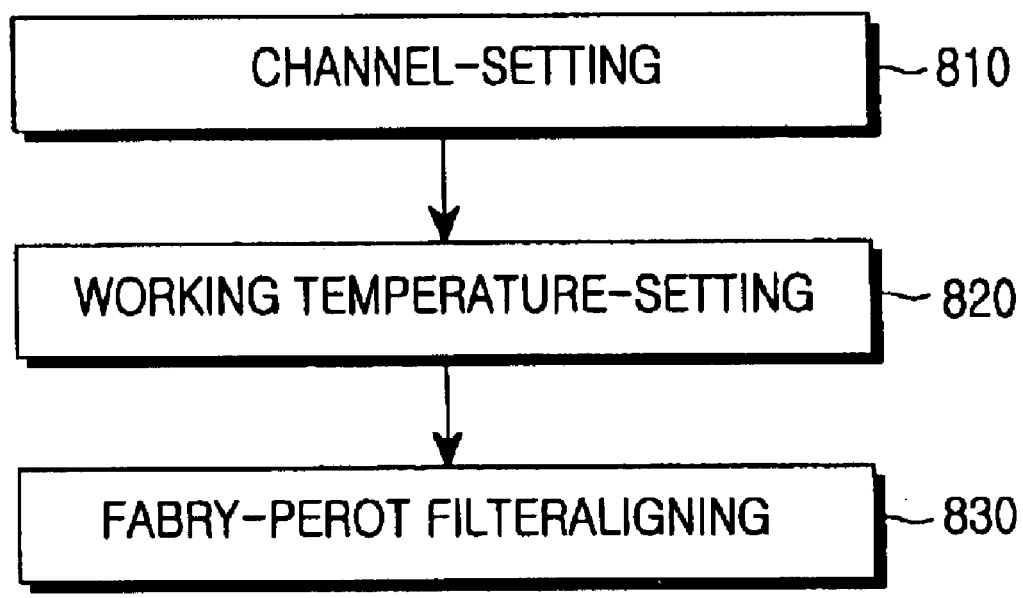
FIG. 8 is a flowchart which shows the procedure in which the controller shown in FIG. 5 works in the second control mode.

FIG. 8 is a flowchart showing the setting procedure of the controller 620 at the second control mode. The setting procedure consists of a channel-setting step 810, a working temperature-setting step 820, and a Fabry-Perot filter-aligning step 830.

The channel-setting step 810 is a step setting a certain channel from the usable ITU channels, wherein one channel is selected from a series of ITU channels.

The working temperature-setting step 820 is a step for adjusting the temperature of the semiconductor light source 540 in order to match the oscillating wavelength of the semiconductor light source 540 with the center of the selected channel. According to this step, the oscillating wavelength of the semiconductor light source 540 shifts towards the center of the selected channel.

The Fabry-Perot filter-aligning step 830 is a step for aligning the wavelength at which the transmittance of the Fabry-Perot filter 570 has a mean value of the maximum transmittance and the minimum transmittance with the oscillating wavelength of the semiconductor light source 540. In this step, the refractive index of the Fabry-Perot filter 580 is changed so that the wavelength at which the transmittance of the Fabry-Perot filter 580 has the mean value of the maximum transmittance and minimum rate is close to or preferably conforms to the oscillating wavelength of the semiconductor light source 540. At this time, the aligning step is performed in such a manner that the magnitude of the electric field applied to the Fabry-Perot filter 570 is increased. That is, the controller 620 finds the aligned state from the power of the electrical signal inputted from the analog/digital converter 610 and raises or lowers the magnitude of the electric field applied to the Fabry-Perot filter 570 until the transmittance of the Fabry-Perot filter 570 is close to or preferably conforms to the mean value of the maximum transmittance and minimum transmittance. For this purpose, the controller 620 outputs the second control signal and the second digital/analog converter 650 converts the second control signal into a digital signal and outputs the digital signal.

Thereafter, the second bias circuit 660 applies an electrical voltage of a predetermined magnitude to the two electrodes 577 and 578 of the Fabry-Perot filter 570 in response to the second control signal and the applied electrical voltage produces a corresponding electric field within the Fabry-Perot filter 570.

Figure 9:
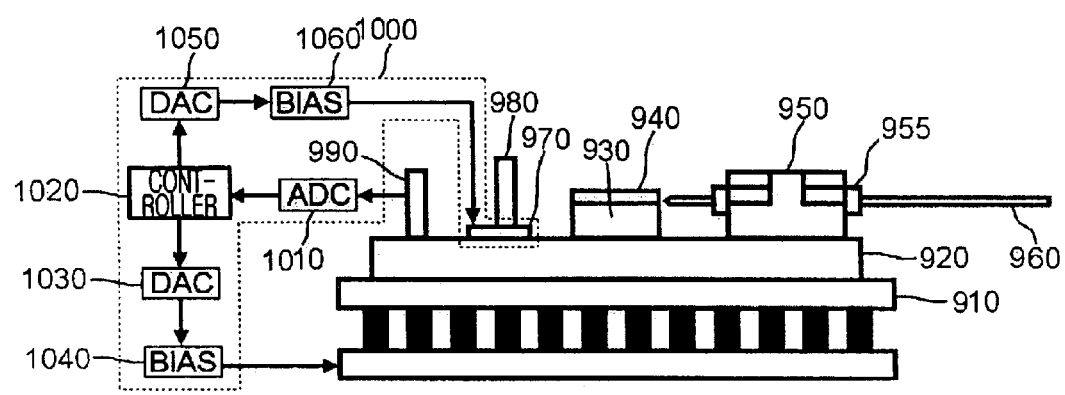
FIG. 9 schematically shows the construction of a wavelength locker for an optical transmitter in accordance with the second embodiment of the present invention; and, FIG. 10 is a cross-sectional view showing the construction of the Fabry-Perot filter shown in FIG. 9.
Figure 10:
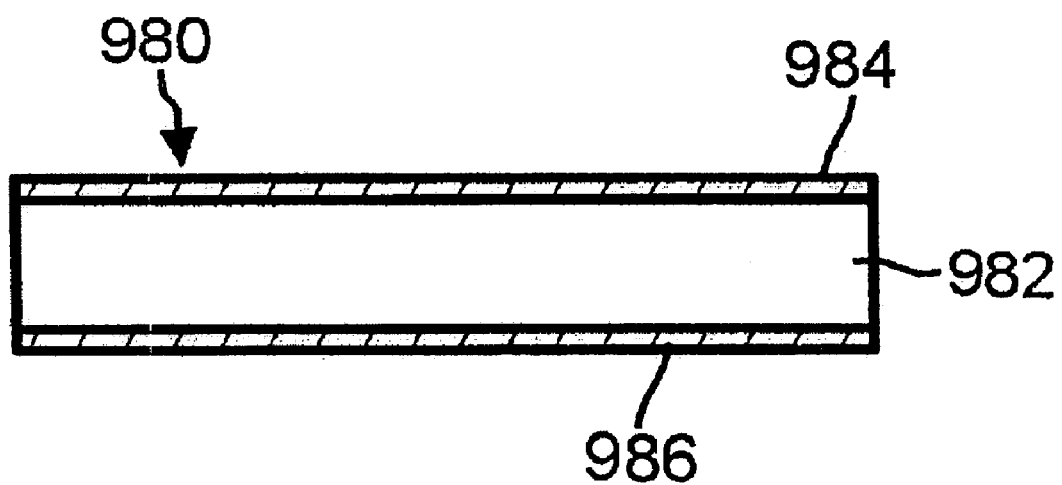

FIG. 9 schematically shows the construction of a wavelength locker for an optical transmitter in accordance with the second embodiment of the present invention. FIG. 10 is a cross-sectional view showing the construction of the Fabry-Perot filter shown in FIG. 9.

The optical transmitter comprises a first heater 910, a substrate 920, a submount 930, a semiconductor light source 940, a support 950, 955, a Fabry-Perot filter 980, a detector 990, and a control circuit 1000, which includes a second heater 970. Below, only the Fabry-Perot filter 980 and the control circuit 1000 are described in order to avoid overlapping.

The second heater 970 is secured to the top surface of the substrate 920 with the bonding material made of AgSn and is operated by an electric current applied thereto. The second heater 970 functions to maintain the temperature of the Fabry-Perot filter 980 to be a constant predetermined value. An electric heat wire may be used for the second heater 970.

The Fabry-Perot filter 980 is interposed between the semiconductor light source 940 and the detector 990 and secured to the top surface of the second heater with the bonding material made of AuSn having a melting point of 280° C. The Fabry-Perot filter 980 includes a spacer 982 formed from a non-linear optical material, and two reflecting layers 984 and 986 each being deposited on one of the front and rear surfaces of the spacer 982. The Fabry-Perot filter 980 has a predetermined transmittance spectrum depending on the thickness and refractive index of the spacer 982. That is, if the light projected through the rear face of the semiconductor light source 940 is incident through the Fabry-Perot filter 980, the power of the transmitted light depends on the wavelength of the light. Therefore, if the power of the light transmitted through the Fabry-Perot filter 980 is measured, it is possible to determine the wavelength of the light. Due to the characteristics of the non-linear optical material, the refractive index of the Fabry-Perot filter 980 changes depending on the electrical field applied thereto, or depending on the change of its internal temperature. Therefore, if the internal temperature of the Fabry-Perot filter 980 is changed, the refractive index of the spacer 982 changes accordingly and thus the transmittance spectrum of the Fabry-Perot filter 980 will shift in relation to the wavelength similar to that shown in FIG. 7.

The control circuit 1000 has two control modes. The first control mode is associated with the optical communication. The second control mode is associated with setting the working condition of the Fabry-Perot filter 980. At the first control mode, the control circuit 1000 corrects the wavelength error when the wavelength does not match with the predetermined wavelength value. At the second control mode, the control circuit 1000 changes the refractive index of the Fabry-Perot filter 980, so that a wavelength at which the transmittance of the Fabry-Perot filter 980 has a mean value of the maximum transmittance and the minimum transmittance is close to or preferably conforms to the oscillating wavelength of the semiconductor light source 940. The control circuit 1000 comprises an analog/digital converter 1010, a controller 1020, first and second digital/analog converters 1030 and 1050, first and second bias circuit 1040 and 1060, and the second heater 970.

The analog/digital converter 1010 converts the electrical signal output by the detector 990 into a digital signal and outputs the digital signal to the controller 1020.

The first digital/analog converter 1030 converts the first control signal generated by the controller into an analog signal and outputs the analog signal to the first bias circuit 1040.

The first bias circuit 1040 applies electric current to the first heater in response to the first control signal. That is, the level of the applied electric current is determined by the first control signal.

The second digital/analog converter 1050 converts the second control signal generated by the controller 1020 into an analog signal and outputs the analog signal to the second bias circuit 1060.

The second bias circuit 1060 applies electric current to the second heater 970 in response to the second control signal. That is, the level of the applied electric current is determined by the second control signal.

The controller 1020 perceives the power of the light from the electrical signal when working at the first control mode and then determines the wavelength of the light from the power of the light. The controller 1020 outputs the first control signal for correcting the wavelength error when the wavelength of the light does not match the predetermined wavelength value.

The setting procedure of the controller 1020 at the second control mode consists of a channel-setting step, a working temperature-setting step, and a Fabry-Perot filter-aligning step.

The channel-setting step is a step setting a certain channel from the usable ITU channels, wherein one channel is selected from a series of ITU channels.

The working temperature-setting step is a step for adjusting the temperature of the semiconductor light source 940 in order to match the oscillating wavelength of the semiconductor light source 940 with the center of the selected channel. According to this step, the oscillating wavelength of the semiconductor light source 940 shifts towards the center of the selected channel.

The Fabry-Perot filter-aligning step is a step for aligning the wavelength at which the transmittance of the Fabry-Perot filter 980 has a mean value of the maximum transmittance and the minimum transmittance with the oscillating wavelength of the semiconductor light source 940. In this step, the refractive index of the Fabry-Perot filter 980 is changed so that the wavelength at which the transmittance of the Fabry-Perot filter 980 has the mean value of the maximum transmittance and minimum transmittance is close to or, preferably conforms to the oscillating wavelength of the semiconductor light source 940. At this time, the aligning step is performed in such a manner that the internal temperature of the Fabry-Perot filter 980 is increased. That is, the controller 1020 finds the aligned state from the power of the electrical signal output by the analog/digital converter 1010 and raises the internal temperature of the Fabry-Perot filter 980 until the transmittance of the Fabry-Perot filter 980 is close to or preferably conforms to the mean value of the maximum transmittance and minimum transmittance. For this purpose, the controller 1020 outputs the second control signal, and the second digital/analog converter 1050 converts the second control signal into a digital signal and outputs the digital signal. Thereafter, the second bias circuit 1060 applies electric current to the second heater 970 in response to the second control signal and the second heater 970 is operated by the applied electric current and thus changes the internal temperature of the Fabry-Perot filter 980 to the selected value.

As described in the above, the wavelength locker for an optical transmitter in accordance with the present invention has the advantage of not requiring the fine geometrical alignment of a Fabry-Perot filter such as angular alignment, because the wavelength locker aligns the oscillating wavelength of a semiconductor light source and a wavelength which has a mean value of the maximum transmittance and the minimum transmittance on the transmittance spectrum by adjusting the refractive index of a spacer provided in the Fabry-Perot filter. The spacer being formed from a non-linear optical material and the transmittance of the Fabry-Perot filter shifts in relation to the wavelength according to the change of the transmittance of the spacer.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A wavelength locker for an optical transmitter, the wavelength locker comprising:

a semiconductor light source for protecting light for optical communication from the front face thereof, an oscillating wavelength of the semiconductor light source changing with a working temperature;

a first heater for maintaining the working temperature of the semiconductor light source at a predetermined value;

a detector for detecting the light projected from the rear face of the semiconductor light source;

a Fabry-Perot filter interposed between the semiconductor light source and the detector including a spacer formed from a non-linear optical material, the transmittance of the Fabry-Perot filter shifts with respect to the wavelength corresponding to a change of the transmittance of the spacer; and a control circuit for changing the refractive index of the Fabry-Perot filter so that the Fabry-Perot filter exhibits a predetermined transmittance in relation to the oscillating wavelength of the semiconductor light source.

2. The wavelength locker according to claim 1, wherein the control circuit comprises: a bias circuit for applying an electrical field to the Fabry-Perot filter; and a controller for determining the transmittance for the oscillating wavelength of the semiconductor light source from the intensity of the light detected by the detector and for controlling the output of the bias circuit.

3. The wavelength locker according to claim 1, wherein the control circuit comprises: a second heater for adjusting an internal temperature of the Fabry-Perot filter; and a controller for determining the transmittance for the oscillating wavelength of the semiconductor light source from the intensity of the light detected by the detector and for adjusting the temperature of the second heater.

4. A method of locking the wavelength of an optical transmitter, the method comprising the steps of: detecting a light projected from a rear face of a semiconductor light source; providing a Fabry-Perot filter with means for shifting a transmittance of the filter with respect to a wavelength of said light in a predetermined manner; and, providing a control circuit for changing a refractive index of the Fabry-Perot filter to exhibit a predetermined transmittance in relation to the oscillating wavelength of the semiconductor light source.

5. The method according to claim 4, wherein the step of providing the means for shifting the transmittance of the Fabry-Perot filter includes forming a spacer from a non-linear optical material.

6. The method according to claim 4, wherein the step of providing the control circuit comprises the steps of: providing a bias circuit for applying an electrical field to the Fabry-Perot filter; and, providing a controller for determining the transmittance for the oscillating wavelength of the semiconductor light source based on an intensity of the light detected and for controlling the output of the bias circuit.

7. The method according to claim 4, wherein the step of providing the control circuit comprises the steps of: providing a heater for adjusting an internal temperature of the Fabry-Perot filter; and, providing a controller for determining the transmittance for the oscillating wavelength of the semiconductor light source based on the intensity of the light detected by the detector and for adjusting the temperature of the heater.

* * * * *